(12) United States Patent
Takahashi

(10) Patent No.: US 9,967,969 B2
(45) Date of Patent: May 8, 2018

(54) MULTILAYER PRINTED CIRCUIT BOARD WITH SWITCHING POWER SUPPLY CAPACITORS, BROAD PATTERNS, AND TT-TYPE FILTER

(71) Applicant: Hitachi, Ltd., Tokyo (JP)

(72) Inventor: Osamu Takahashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days. days.

(21) Appl. No.: 15/126,292

(22) PCT Filed: Apr. 21, 2014

(86) PCT No.: PCT/JP2014/061118
§ 371 (c)(1),
(2) Date: Sep. 15, 2016

(87) PCT Pub. No.: WO2015/162656
PCT Pub. Date: Oct. 29, 2015

(65) Prior Publication Data
US 2017/0086289 A1 Mar. 23, 2017

(51) Int. Cl.
*H05K 1/02* (2006.01)
*H02M 1/14* (2006.01)
(Continued)

(52) U.S. Cl.
CPC ............ *H05K 1/0233* (2013.01); *H02M 1/14* (2013.01); *H03H 7/0115* (2013.01); *H05K 1/144* (2013.01);
(Continued)

(58) Field of Classification Search
None
See application file for complete search history.

(56) References Cited

U.S. PATENT DOCUMENTS 4,916,380 A * 4/1990 Burroughs .............. H02M 1/14
323/266
4,937,540 A * 6/1990 Carlson ................... H02M 1/14
333/12

(Continued)

FOREIGN PATENT DOCUMENTS

JP 2009-207350 A 9/2009

OTHER PUBLICATIONS

International Search Report of PCT/JP2014/061118 dated Jul. 15, 2014.

*Primary Examiner* — Dimary Lopez Cruz
*Assistant Examiner* — Muhammed Azam
(74) *Attorney, Agent, or Firm* — Mattingly & Malur, PC

(57) ABSTRACT

A multilayer printed circuit board includes a plurality of wire layers and mounted with a switching power supply, wherein at least three broad patterns, which are formed on at least three wire layers, and a via for connecting the at least three broad patterns are provided to a power supply path connecting a connector, which is to be connected to an external power supply, and the switching power supply, a first capacitor is connected to the connector-side broad pattern, a second capacitor is connected to the switching power supply-side broad pattern, and a π-type filter is configured with parasitic inductance, which is generated by the at least three broad patterns and the via, the first capacitor, and the second capacitor.

8 Claims, 5 Drawing Sheets

(51) Int. Cl.
  *H05K 1/16* (2006.01)
  *H03H 7/01* (2006.01)
  *H05K 1/18* (2006.01)
  *H05K 1/14* (2006.01)
  *H05K 1/11* (2006.01)

(52) U.S. Cl.
  CPC .............. *H05K 1/165* (2013.01); *H05K 1/181* (2013.01); *H05K 1/115* (2013.01); *H05K 2201/0979* (2013.01); *H05K 2201/09718* (2013.01); *H05K 2201/10015* (2013.01)

(56) References Cited

U.S. PATENT DOCUMENTS

| | | | | |
|---|---|---|---|---|
| 5,668,511 A * | 9/1997 | Furutani | ............... | H01P 1/2039 333/185 |
| 5,909,350 A * | 6/1999 | Anthony | ............. | H03H 1/0007 333/182 |
| 6,212,086 B1 * | 4/2001 | Dinh | ................. | H02M 3/00 363/144 |
| 6,365,828 B1 * | 4/2002 | Kinoshita | ............. | H01L 23/552 174/359 |
| 6,512,181 B2 * | 1/2003 | Okubo | ............... | G01R 31/2812 174/255 |
| 6,757,178 B2 * | 6/2004 | Okabe | ................ | H01L 21/4857 257/E23.062 |
| 6,873,513 B2 * | 3/2005 | Anthony | ............... | H01G 4/012 257/E23.079 |
| 6,909,052 B1 * | 6/2005 | Haug | ................... | H05K 1/0224 174/255 |
| 6,936,999 B2 * | 8/2005 | Chapuis | ................... | H02J 1/08 323/282 |
| 7,050,284 B2 * | 5/2006 | Anthony | ................ | H01G 4/012 361/118 |
| 7,110,227 B2 * | 9/2006 | Anthony | ................ | H01G 4/012 257/E23.067 |
| 7,237,218 B2 * | 6/2007 | Shrowty | ................ | G11C 5/063 257/E23.142 |
| 7,301,748 B2 * | 11/2007 | Anthony | ........... | H01L 23/49822 257/E23.062 |
| 7,443,647 B2 * | 10/2008 | Anthony | ................ | H01C 7/123 361/118 |
| 7,492,570 B2 * | 2/2009 | Hosomi | .................. | H01L 23/13 361/303 |
| 7,795,728 B2 * | 9/2010 | Przadka | ................ | H03H 9/0542 257/723 |
| 8,130,052 B2 * | 3/2012 | Okano | ................. | H05K 1/0233 333/12 |
| 8,212,150 B2 * | 7/2012 | Kim | ..................... | H05K 1/0236 174/256 |
| 9,226,386 B2 * | 12/2015 | Rotigni | ................ | H05K 1/0231 |
| 2006/0050491 A1 * | 3/2006 | Hayashi | ................ | H05K 1/0231 361/760 |
| 2007/0109709 A1 * | 5/2007 | Anthony | ................... | H01G 4/35 361/118 |
| 2007/0136618 A1 * | 6/2007 | Ohsaka | ................ | G06F 1/188 713/323 |
| 2009/0267704 A1 * | 10/2009 | Chang | ..................... | H03H 1/02 333/175 |
| 2009/0295503 A1 * | 12/2009 | Harada | ................ | H03H 7/0115 333/174 |
| 2010/0039784 A1 * | 2/2010 | Hayashi | ................ | H05K 1/0231 361/777 |
| 2010/0108373 A1 * | 5/2010 | Park | .................. | H01L 23/49822 174/376 |
| 2010/0321910 A1 * | 12/2010 | Hsu | ..................... | H05K 1/0231 361/782 |
| 2016/0157336 A1 * | 6/2016 | Murai | .................. | H05K 1/0225 361/782 |
| 2017/0086289 A1 * | 3/2017 | Takahashi | ............... | H02M 1/14 |

\* cited by examiner

MULTILAYER PRINTED CIRCUIT BOARD WITH SWITCHING POWER SUPPLY CAPACITORS, BROAD PATTERNS, AND TT-TYPE FILTER

TECHNICAL FIELD

The present invention relates to a multilayer printed circuit board mounted with a switching power supply.

BACKGROUND ART

A general printed circuit board is configured such that a resistor, a capacitor, an inductor, an integrated circuit and the like are mounted on its surface, and an electronic circuit is realized by electrically connecting the respective parts with a conductive member such as copper foil. As simple printed circuit boards, there are types in which copper foil is provided only on the front surface and there are double-sided boards in which copper foil is provided only on the front surface and rear surface. However, as the printed circuit boards that are used in personal computers and servers, multilayer printed circuit boards in which copper foil is also provided to the inside of the printed circuit board are generally used in order to realize a multifunctional circuit with a limited surface area.

With these printed circuit boards, while it is standard practice to realize a circuit only with the mounted parts, there are cases where a fuse, an inductor, a capacitor and the like are equivalently realized by using the copper foil of the board so as to omit the mounting of parts. For example, as described in Japanese Unexamined Patent Application Publication No. 2009-207350, the pattern on the surface of the board is formed in a spiral shape and in an elongated manner to generate parasitic inductance and parasitic capacitance so as to omit the mounting of parts.

CITATION LIST

Patent Literature

PTL 1: Japanese Laid-open Patent Application Publication No. 2009-207350

SUMMARY OF THE INVENTION

Problems to be Solved by the Invention

With the printed circuit board using the conventional technology disclosed in PTL 1, the object is to simultaneously generate parasitic inductance components and parasitic capacitance components with a pattern. However, while the parasitic inductance will increase as the width of the pattern is smaller and the length of the pattern is longer, the parasitic capacitance will increase as the width of the pattern is larger and the surface area is broader. Thus, it is necessary to simultaneously satisfy conflicting requirements.

Since a conductor such as a pattern has induction components, the pattern generates parasitic inductance. This parasitic inductance is expressed with the following expression when the length of the print pattern is Lp [mm], the width is Wp [mm], and the thickness (height) is Hp [mm].

$$0.0002 Lp[\ln\{2Lp/(Wp+Hp)\}+0.2235\{(Wp+Hp)/Lp\}+0.5][\mu H]$$

Meanwhile, when two conductors, which are not electrically connected, are not completely shielded, parasitic capacitance, which is a capacitive component, is generated. The electrostatic capacity of this parasitic capacitance is expressed with the following expression when the relative permittivity between the patterns is Er, the area of the print pattern is A [cm2], and the distance between the patterns is d [cm].

$$0.00885 \times \varepsilon r \times A/d [pF]$$

This shows that the parasitic capacitance will increase as the area A of the pattern is larger and the distance d between the patterns is shorter.

Accordingly, with a spiral structure using the surface layer, the parasitic inductance L will decrease when the width Wp of the print pattern is broadened in order to increase the parasitic capacitance.

In other words, it was difficult to obtain large parasitic inductance with the spiral pattern of the conventional technology. Furthermore, if the length of the pattern is increased and the wiring area of the inductance pattern is increased in order to obtain large parasitic inductance, there is a problem in that the wiring area of the circuit pattern and the mounting area of the parts will decrease.

Means to Solve the Problems

Provided is a multilayer printed circuit board comprising a plurality of wire layers and mounted with a switching power supply, wherein at least three broad patterns, which are formed on at least three wire layers, and a via for connecting the at least three broad patterns are provided to a power supply path connecting a connector, which is to be connected to an external power supply, and the switching power supply, a first capacitor is connected to the connector-side broad pattern, a second capacitor is connected to the switching power supply-side broad pattern, and a π-type filter is configured with parasitic inductance, which is generated by the at least three broad patterns and the via, the first capacitor, and the second capacitor.

Advantageous Effects of the Invention

Since a π-type filter without an inductor can be realized by using the printed circuit board of the present invention, it is possible to provide a printed circuit board capable of reducing costs and reducing the mounting area.

DESCRIPTION OF EMBODIMENTS

An embodiment of the multilayer printed circuit board of the present invention is now explained in detail with reference to the appended drawings.

Figure 1:
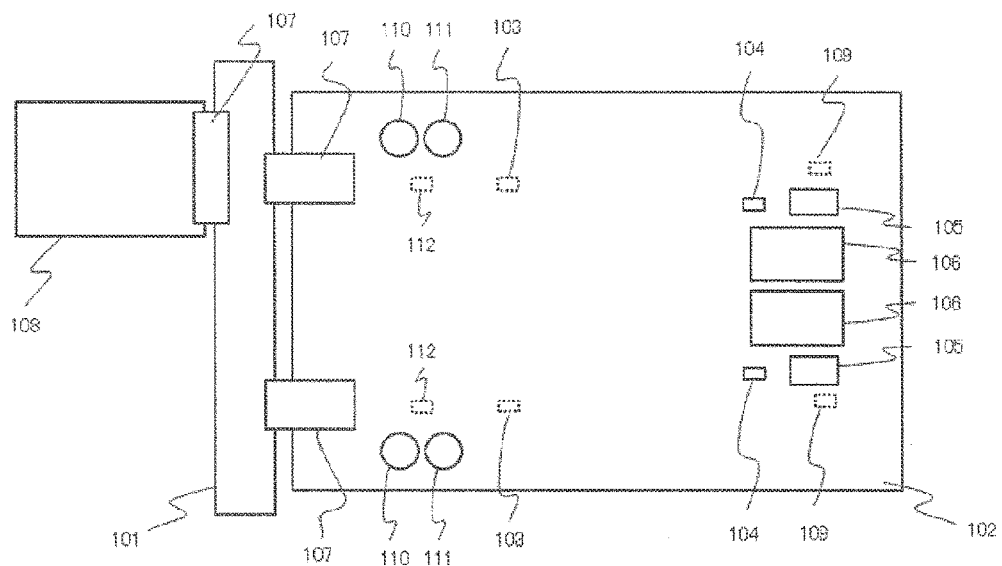
FIG. 1 is an overall configuration diagram of a server device equipped with the multilayer printed circuit board of the present invention.

FIG. 1 is an overall configuration diagram of a server device equipped with the multilayer printed circuit board of the present invention.

An AC/DC power supply 108 is a device for converting the voltage of 200 V or the like, which is supplied from the outside, into 12 V, and the converted voltage is supplied to a main board 102 through a backplane board 101 connected with a connector 107. A CPU 106 that is mounted on the CPU board 102 is connected to the AC/DC power supply 108 through a switching power supply 105 mounted on the CPU board 102, and the switching power supply 105 receives the 12 V supplied from the AC/DC power supply 108 and converts the supplied 12 V into 0.9 V which is required by the CPU 106. Ceramic capacitors for reducing the noise generated by the switching power supply 105 are disposed between the connector 107 and the switching power supply 105, and the ceramic capacitor near the connector 107 is referred to as a Filter Capacitor and the ceramic capacitor near the switching power supply 105 is referred to as an IC-side Capacitor, and these capacitors are hereinafter respectively referred to as the "Cap-Filter" and "Cap-IC".

The Cap-Filter 103 and the Cap-ICs 104, 109 are connected between the connector 107 and the switching power supply 105, the Cap-Filter 103 is disposed on the back layer of the CPU board 102, the Cap-IC 104 is disposed on the surface layer of the CPU board 102, and the Cap-IC 109 is disposed on the back layer of the CPU board 102. Furthermore, aluminum electrolytic capacitors 110, 111 and a ceramic capacitor 112 are disposed between the connector 107 and the switching power supply 105 for reducing the noise generated between the connector 107 and the switching power supply 105.

Figure 2:
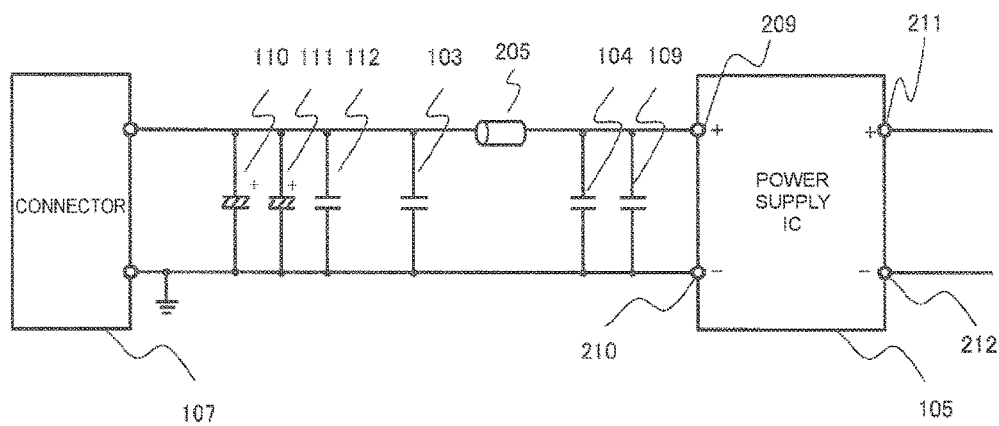
FIG. 2 is a circuit diagram of a CPU board pertaining to the multilayer printed circuit board of the present invention.

FIG. 2 is a circuit diagram of the CPU board 102 pertaining to the multilayer printed circuit board of the present invention. A conductor 205 and the Cap-ICs 104, 109 are connected to an input terminal (+) 209 of the switching power supply 105. The aluminum electrolytic capacitors 110, 111, the ceramic capacitor 112, the Cap-Filter 103, the Cap-ICs 104, 109, and the connector 107 are connected to an input terminal (−) 210 of the switching power supply 105. The conductor 205 is connected to the aluminum electrolytic capacitors 110, 111, the ceramic capacitor 112, the Cap-Filter 103, the Cap-ICs 104, 109, and a connector 213. The CPU 106 is connected to an output terminal (+) 211 of the switching power supply 105 and an output terminal (−) 212 of the switching power supply 105 (not shown).

The conductor 205 is configured from a print pattern and Vias, and this is where parasitic inductance is generated. Details will be described later.

Figure 3:
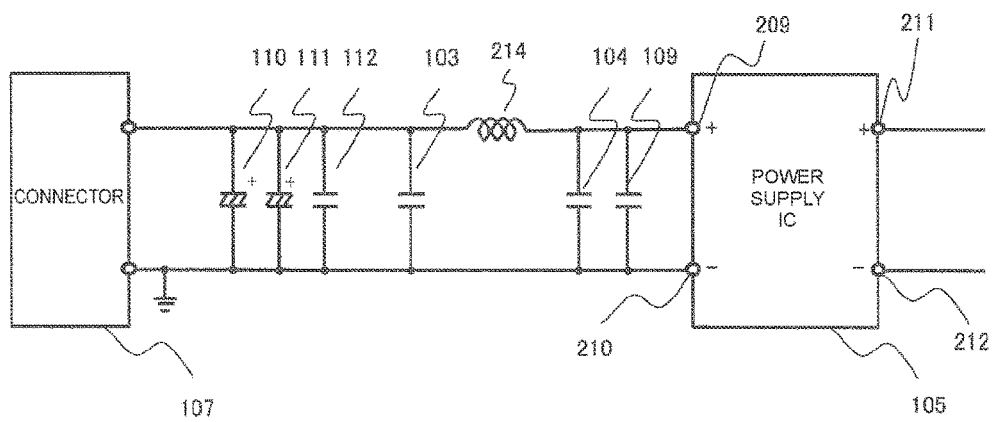
FIG. 3 is a diagram showing an equivalent circuit of the CPU board circuit illustrated in FIG. 2.

FIG. 3 is a diagram showing an equivalent circuit of the CPU board circuit illustrated in FIG. 2. Parasitic inductance 214 is the parasitic inductance that is generated in the conductor 205 illustrated in FIG. 2. The aluminum electrolytic capacitors 110, 111, and the ceramic capacitor 112 are bypass capacitors for eliminating the noise generated between the connector 107 and the switching power supply 105. Furthermore, the Cap-Filter 103, the parasitic inductance 214, and the Cap-ICs 104, 109 are π-type filter for eliminating the noise generated by the switching power supply 105.

Figure 4:
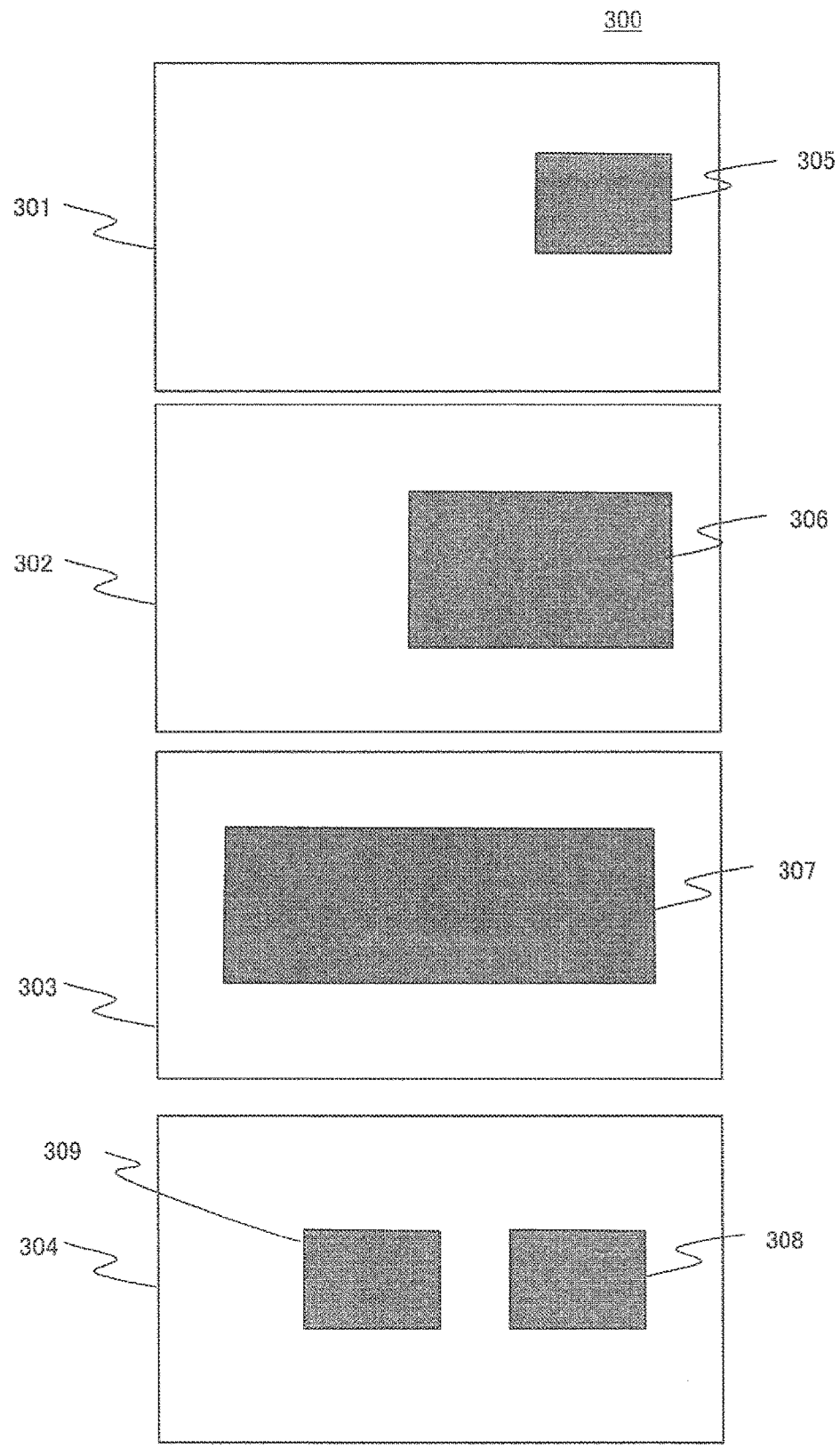
FIG. 4 is a top view of the multilayer printed circuit board of the present invention.

FIG. 4 is a top view of the respective layers of the multilayer printed circuit board 300 of the present invention. A broad pattern 305 is formed on a surface layer 301. A broad pattern 306 is formed on an inner layer wire layer 302. An inner layer power supply solid filling 307 is formed on a 12 V power supply layer 303. Broad patterns 308, 309 are formed on a back layer 304.

Figure 5:
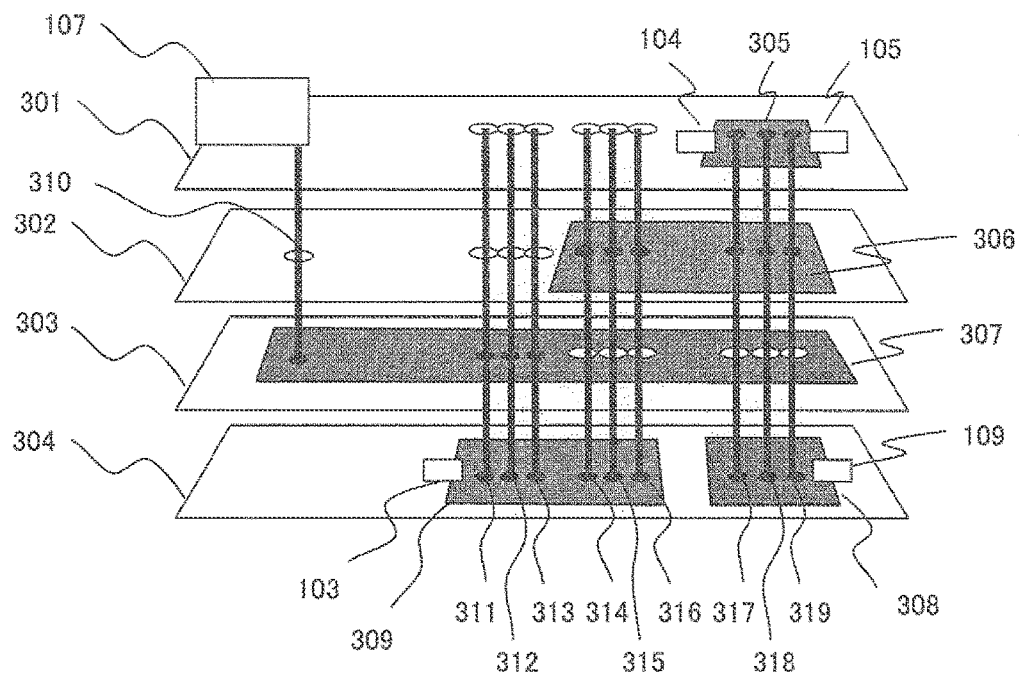
FIG. 5 is a perspective view of the multilayer printed circuit board of the present invention.
Figure 6:
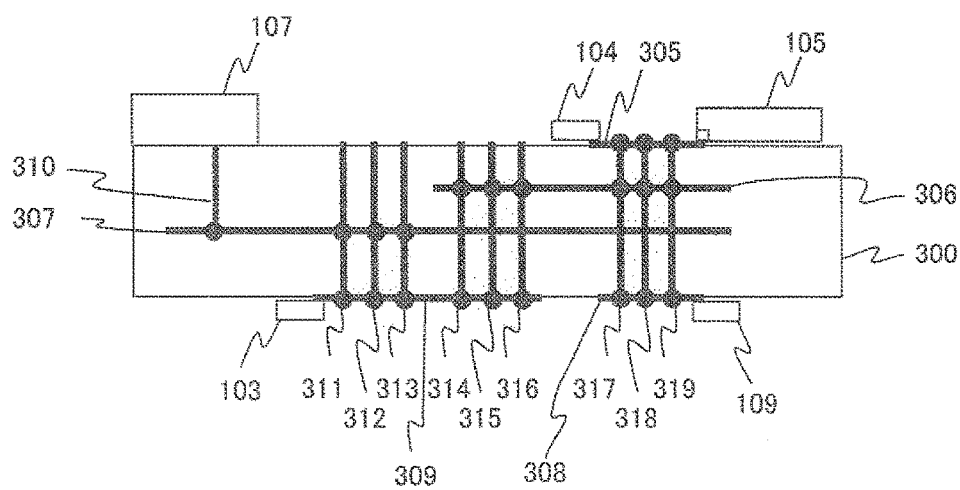
FIG. 6 is a cross section of the multilayer printed circuit board of the present invention.

FIG. 5 is a perspective view of the multilayer printed circuit board 300 of the present invention, and FIG. 6 is a cross section of the multilayer printed circuit board 300. The broad pattern 305 of the surface layer 301 is connected to the Cap-IC 104, the switching power supply 105 and Vias 317, 318, 319, and connected to the broad pattern 306 of the inner layer wire layer 302 and the broad pattern 308 of the back layer 304 through the Vias 317, 318, 319. The broad pattern 306 of the inner layer wire layer 302 is connected to Vias 314, 315, 316, 317, 318, 319, and connected to the broad pattern 309 of the back layer 304 through the Vias 314, 315, 316. The inner layer power supply solid filling 307 of the 12 V power supply layer 303 are connected to Vias 310, 311, 312, 313, and connected to the connector 324 through the Via 310 and connected to the broad pattern 309 of the back layer 304 through the Vias 311, 312, 313. The broad pattern 308 of the back layer 304 is connected to the Cap-IC 109 and Vias 317, 318, 319, and connected to the broad pattern 305 of the surface layer 301 and the connected to the broad pattern 306 of the inner layer wire layer 302 through the Vias 317, 318, 319. The broad pattern 309 of the back layer 304 is connected to the Cap-Filter 103 and Vias 311, 312, 313, 314, 315, 316, and connected to the inner layer power supply solid filling 307 of the 12 V power supply layer 303 through the Vias 311, 312, 313 and connected to the broad pattern 306 of the inner layer wire layer 302 through the Vias 314, 315, 316.

The reduction of noise when voltage is supplied from the AC/DC power supply 108 to the switching power supply 105 illustrated in FIG. 1 is now explained.

A server device comprises a circuit in which the voltage supplied from the AC/DC power supply 108 reaches the switching power supply 105 through the connector 107 and reaches the CPU 106 from the switching power supply 105, and further comprises an equivalent circuit depicted in FIG. 3 between the connector 107 and the switching power supply 105.

The aluminum electrolytic capacitors 110, 111, and the ceramic capacitor 112 are bypass capacitors provided between the connector 107 and the switching power supply 105 for eliminating the noise generated by parts other than the switching power supply 105, and the capacity of the aluminum electrolytic capacitor and the ceramic capacitor is determined generally based on the noise frequency and noise voltage.

The Cap-Filter 103, the parasitic inductance 214, and the Cap-ICs 104, 109 are π-type filters for eliminating the noise generated by the switching power supply 105, and the capacity thereof is determined based on the noise frequency and noise voltage.

The parasitic inductance configuring the π-type filter is generated in the broad pattern 309 of the back layer 304, the broad pattern 306 of the inner layer wire layer 302, and the broad pattern 305 of the surface layer 301 of the multilayer printed circuit board 300 illustrated in FIG. 5, between the broad pattern 309 of the back layer 304 and the inner layer power supply solid filling 307 of the 12 V power supply layer among the Vias 311, 312, 313, between the broad pattern 306 of the inner layer wire layer 302 and the broad pattern 309 of the back layer 304 among the Vias 314, 315, 316, and between the broad pattern 306 of the inner layer wire layer 302 and the broad pattern 305 of the surface layer 301 among the Vias 317, 318, 319. The parasitic inductance that is generated in the broad patterns is expressed with the following expression (1) when the length of the print pattern is Lp [mm], the width is Wp [mm], and the thickness (height) is Hp [mm].

$$0.0002Lp[ln\{2Lp/(Wp+Hp)\}+0.2235\{(Wp+Hp)/Lp\}+0.5][\mu H] \quad (1)$$

Moreover, the parasitic inductance generated in the Vias is expressed with the following expression (2) when the height of the Via is H [mm], and the diameter is d [mm].

$$2H(ln(4H/d)+1)[nH] \quad (2)$$

The π-type filter circuit for eliminating noise is configured by connecting the Cap-Filter 103 on the connector side and connecting the Cap-ICs 104, 109 to the side of the switching power supply 105 with the parasitic inductance 214 sandwiched therebetween, and the noise generated by the switching power supply 105 is thereby reduced.

Here, the π-type filter circuit having a cutoff frequency of 1 [MHz] is explained as an example. Of the capacitor capacity C, when the total capacitance of the Cap-Filter is set to 1 [μF] and the capacitance of the Cap-IC is set to 1 [μF] so that the total capacitance C is 2 [μF], the cutoff frequency fc that can be expected from this π-type filter circuit is obtained as follows.

$$fc=1/(2\pi\sqrt{(L\times C)})$$

Accordingly, since the parasitic inductance L that can be expected from fc=1 [MHz], C=2 [μF] based on the foregoing expression is 0.080 [μH], the parasitic inductance L that can be expected from the Vias and the print pattern upon configuring the π-type filter circuit is 0.080 [μH].

With a print pattern having a length Lp=15 [mm], a width Wp=10 [mm], and a thickness (height) Hp=0.035 [mm], the parasitic inductance L is 0.00523 [μH] based on expression (1) for obtaining the inductance of the print pattern, and by forming a print pattern in which the print patterns of three locations are all of the same shape, the parasitic inductance L generated at the print patterns of three locations is 0.0157 [μH].

Furthermore, with regard to the parasitic inductance generated in the Vias, the parasitic inductance L1 generated in the Vias 311, 312, 313 between the inner layer power supply solid filling 307 of the 12 V power supply layer 303 and the broad pattern 309 of the back layer 304 of the multilayer printed circuit board 300 is L=0.019 [μH] when H=1.2 [mm], d=0.5 [mm], and the number of Vias is three Vias. Next, the parasitic inductance L2 generated in the Vias 314, 315, 316 connecting the broad pattern 309 of the back layer 304 and the broad pattern 306 of the inner layer wire layer 302 is L=0.040 [μH] when H=2.2 [mm], d=0.5 [mm], and the number of Vias is three Vias. Next, the parasitic inductance L3 generated in the Vias 317, 318, 319 connecting the broad pattern 306 of the inner layer wire layer 302 and the broad pattern 305 of the surface layer 301 is L=0.0046 [μH] when H=0.3 [mm], d=0.5 [mm], and the number of Vias is three Vias. Accordingly, the total parasitic inductance generated in L1, L2, L3 is 0.063 [μH].

Accordingly, the total parasitic inductance of the parasitic inductance 0.0157 [μH] generated in the print pattern and the parasitic inductance generated in the respective Vias is 0.063 [μH], and the total parasitic inductance generated in the print pattern and the respective Vias is L=0.079 [μH].

Figure 7:
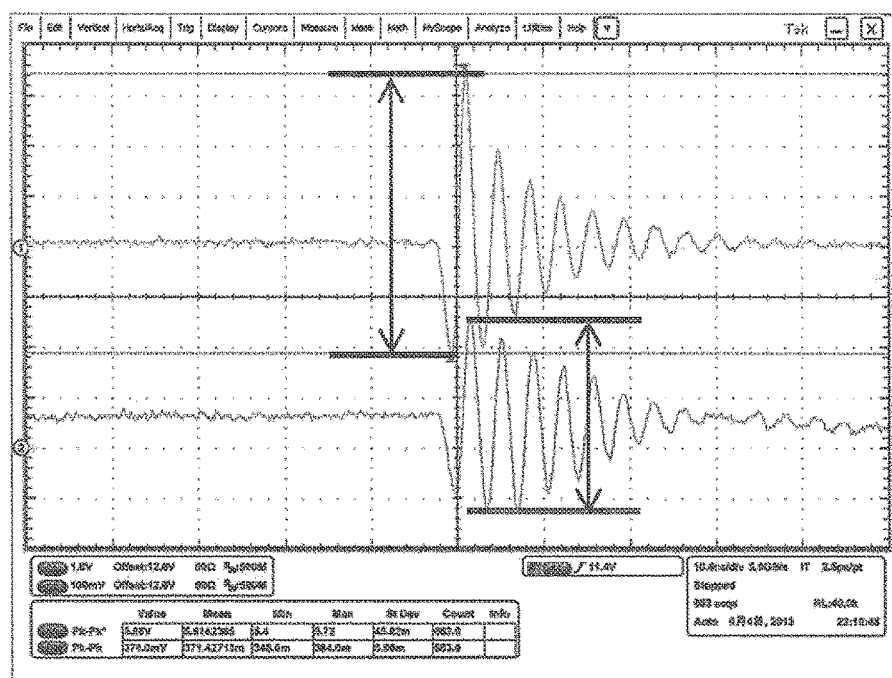
FIG. 7 is a waveform showing the noise reduction of the multilayer printed circuit board of the present invention.

FIG. 7 is a waveform screen of an oscilloscope showing the results of the noise reduction effect of the printed circuit board using the foregoing print pattern and vias. Here, the upper waveform is the 12 V voltage waveform acquired with the Via 310 of FIG. 4, and the vertical axis is 1 [V/div] and the Offset is set to 12 [V]. The lower waveform is the voltage waveform after the noise reduction measured with the power supply IC 323 of FIG. 4, and the vertical axis is 100 [mV/div] and the Offset is set to 12 [V]. As shown in FIG. 7, while high frequency noise of 1 [MHz] was generated in the 12 V supply line of the printed circuit board at a level of 5.5 [V] at the time of input of the printed circuit board, the noise attenuated to 0.38 [V] in the input terminal of the switching power supply.

As described above, by using the present invention, parasitic inductance can be generated and a π-type filter can be configured without having to mount an inductor, and it is possible to provide a server device with reduced noise.

REFERENCE SIGNS LIST

101: Backplane board
102: CPU board
103: Cap-Filter
104: Cap-IC
105: Switching power supply
106: CPU
107: Connector
108: AC/DC power supply
109: Cap-IC
110, 111: Aluminum electrolytic capacitor
112: Ceramic capacitor
205: Conductor
214: Parasitic inductance
300: Multilayer printed circuit board
301: Surface layer
302: Inner layer wire layer
303: 12 V power supply layer
304: Back layer
305: Broad pattern of surface layer
306: Broad pattern of inner layer wire layer
307: Inner layer power supply solid filling of 12 V power supply layer
308, 309: Broad pattern of back layer
310, 311, 312, 313, 314, 315, 316, 317, 318, 319: Via

The invention claimed is:

1. A multilayer printed circuit board comprising a plurality of wire layers and mounted with a switching power supply, wherein at least three broad patterns, which are formed on at least three wire layers, and a via for connecting the at least three broad patterns are provided to a power supply path connecting a connector, which is to be connected to an external power supply, and the switching power supply, a first capacitor is connected to the connector-side broad pattern, a second capacitor is connected to the switching power supply-side broad pattern, and a π-type filter is configured with parasitic inductance, which is generated by the at least three broad patterns and the via, the first capacitor, and the second capacitor.

2. The multilayer printed circuit board according to claim 1, wherein the via is configured from a plurality of vias.

3. The multilayer printed circuit board according to claim 1, wherein a first via for connecting the broad pattern formed on a surface layer and the broad pattern formed on an inner layer wire layer and a second via for connecting the broad pattern formed on the inner layer wire layer and the broad pattern formed on a back layer are provided.

4. The multilayer printed circuit board according to claim 3, wherein the first via and the second via are each configured from a plurality of vias.

5. The multilayer printed circuit board according to claim 3, wherein the switching power supply and the second capacitor are connected to the broad pattern formed on the surface layer, and the first capacitor is connected to the broad pattern formed on the back layer.

6. The multilayer printed circuit board according to claim 2, wherein a third via for connecting the broad pattern formed on the back layer and a solid filling of an inner layer power supply layer is provided.

7. The multilayer printed circuit board according to claim 6, wherein the third via is configured from a plurality of vias.

8. A server device mounted with the multilayer printed circuit board according to claim 1.

* * * * *